United States Patent
Wake et al.

(10) Patent No.: US 6,436,811 B1
(45) Date of Patent: *Aug. 20, 2002

(54) METHOD OF FORMING A COPPER-CONTAINING METAL INTERCONNECT USING A CHEMICAL MECHANICAL PLANARIZATION (CMP) SLURRY

(75) Inventors: Tomoko Wake; Yasuaki Tsuchiya, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/741,131

(22) Filed: Dec. 19, 2000

(30) Foreign Application Priority Data

Dec. 28, 1999 (JP) .......................................... 11-374482

(51) Int. Cl.$^7$ ......................................... H01L 21/4763
(52) U.S. Cl. ...................... 438/633; 438/672; 438/687; 438/688; 438/693
(58) Field of Search ............................... 438/633, 672, 438/687, 688, 693

(56) References Cited

U.S. PATENT DOCUMENTS

| | | | | | |
|---|---|---|---|---|---|
| 5,527,423 A | * | 6/1996 | Neville et al. | ............ | 156/636.1 |
| 5,637,185 A | * | 6/1997 | Murarka et al. | ............ | 438/693 |
| 5,858,813 A | * | 1/1999 | Scherber et al. | ............ | 438/693 |
| 6,000,997 A | * | 12/1999 | Kao et al. | ............ | 451/7 |
| 6,015,506 A | * | 1/2000 | Streinz et al. | ............ | 252/186.1 |
| 6,117,775 A | * | 9/2000 | Kondo et al. | ............ | 438/693 |
| 6,139,763 A | * | 10/2000 | Ina et al. | ............ | 216/89 |
| 6,258,137 B1 | * | 7/2001 | Garg et al. | ............ | 438/693 |
| 2001/0006841 A1 | * | 7/2001 | Tsuchiya et al. | ............ | 438/584 |

FOREIGN PATENT DOCUMENTS

| | | |
|---|---|---|
| JP | 8-83780 | 3/1996 |
| JP | 10-044047 | 2/1998 |
| JP | 10-046140 | 2/1998 |
| JP | 10-116804 | 5/1998 |
| JP | 10-163141 | 6/1998 |
| JP | 11-021546 | 1/1999 |
| JP | 11-238709 | 8/1999 |

OTHER PUBLICATIONS

Cotton, J.B., "Control Of Surface Reactions On Copper by Means of Organic Reagents", Proc. 2nd Intern. Congr. Metallic Corrosion, 1963, pp. 590–596.

Chadwick, D., et al., "Adsorbed Corrosion Inhibitors Studied By Electron Spectroscopy: Benzotriazole On Copper And Copper Alloys", Corrosion Science, 18, 1978, pp. 39–51.

Notodani, T., Bousei Kanri, 26(3), 1982, pp. 74–79.

Okabe, H., ed., "Sekiyu Seihin Tenkazai no Kaihatsu to Saishin Gijutsu", 1998, CMC, pp. 77–82.

* cited by examiner

Primary Examiner—John F. Niebling
Assistant Examiner—Lynne A. Gurley
(74) Attorney, Agent, or Firm—Scully, Scott, Murphy & Presser

(57) ABSTRACT

This invention relates to a process for forming a metal interconnect comprising the steps of forming a concave in an insulating film formed on a substrate, forming a copper-containing metal film over the whole surface such that the concave is filled with the metal and then polishing the copper-containing metal film by chemical mechanical polishing, characterized in that the polishing step is conducted using a chemical mechanical polishing slurry comprising a polishing material, an oxidizing agent and an adhesion inhibitor preventing adhesion of a polishing product to a polishing pad, while contacting the polishing pad to a polished surface with a pressure of at least 27 kPa. This invention allows us to prevent adhesion of a polishing product to a polishing pad and to form a uniform interconnect layer with an improved throughput, even when polishing a large amount of copper-containing metal during a polishing step.

10 Claims, 4 Drawing Sheets

PRIOR ART

METHOD OF FORMING A COPPER-CONTAINING METAL INTERCONNECT USING A CHEMICAL MECHANICAL PLANARIZATION (CMP) SLURRY

BACKGROUND OF THE INVENTION

1. Field of the Invention

This invention relates to a process for forming an electric interconnect made of a copper-containing metal by chemical mechanical polishing.

2. Description of the Prior Art

With regard to forming a semiconductor integrated circuit such as ULSI which has been significantly refined and compacted, copper has been expected to be a useful material for electric connection because of its good electromigration resistance and lower electrical resistance.

To date a copper interconnect is; formed as follows due to problems such as difficulty in patterning by dry etching. Specifically, a concave such as a groove and a connection hole is formed in an insulating film, a barrier metal film is formed on the surface, a copper film is deposited over the whole surface by plating such that the concave is filled with the material, and then the surface is polished to be flat by chemical mechanical polishing (hereinafter, referred to as "CMP") until the surface of the insulating film except the concave area is completely exposed, to form electric connections such as a damascene interconnect in which the concave is filled with copper, a via plug and a contact plug.

There will be described a process for forming a damascene copper interconnect with reference to FIG. 1.

As shown in FIG. 1(a), on a first interlayer insulating film 1 in which a lower-layer interconnect 2 is formed are sequentially formed a silicon nitride film 3 and a second interlayer insulating film 4. Then in the second interlayer insulating film 4 is formed a concave having an interconnect pattern, in a part of which is formed a connecting hole reaching the lower-layer interconnect 2.

Then, as shown in FIG. 1(b), a barrier metal film 5 is formed by sputtering. On the whole surface of the film is formed a copper film 6 by plating such that the concave is filled with the material. The thickness of the plating is larger than the sum of the depth of the groove, the depth of the connecting hole and a manufacturing dispersion in the plating step.

As shown in FIG. 1(c), the copper film 6 is polished by CMP using a polishing pad in the presence of a polishing slurry to make the substrate surface flat. polishing is continued until the metal over the second insulating film 4 is completely removed, as shown in FIG. 1(d).

A slurry for CMP for polishing copper generally comprises an oxidizing agent and polishing grains. A basic mechanism is that the copper surface is etched by chemical action of the oxidizing agent while the oxidized surface layer is mechanically removed by polishing grains.

Primary particles of α-alumina with an average particle size (diameter) of several hundred nm have been conventionally used as polishing grains in a polishing slurry having a large polishing rate for a copper film, because primary particles having a desired average particle size can be easily manufactured and have a higher polishing rate.

As a semiconductor device has been more refined and more integrated, leading to a more complicated device structure, and as there has been an increased number of layers in a multilayer aimed at reducing the interconnect length for dealing with an increase in an interconnected resistance associated with refinement of an interconnect or a multilayer in a logic system, a substrate surface had become more bumpy and its level difference had become larger. An upper interconnect in a multilayer interconnect is used for a source interconnect, a signal interconnect or a clock interconnect, and therefore, an interconnect groove must be deeper for improving some properties by reducing resistances in these interconnects. As a result, an interlayer insulating film formed on such a substrate surface had become thicker and thus it has been necessary to form a thick copper film by which a deep concave can be filled, for forming a damascene conductive part such as a damascene copper interconnect or via plug in a thick interlayer insulating film. For reducing a resistance of a refined interconnect or reducing a resistance of a signal or clock interconnect to improve a conduction speed, it is necessary to form an interconnect which is thick in a depth direction, so that copper film is formed for providing a deep concave. When a source interconnect is formed with a damascene copper interconnect, a thick copper film is formed for reducing a resistance of the source interconnect for minimizing a potential change. While conventionally a copper film with a thickness of about several hundred nm has been adequately useful, several thousand nm may be sometimes required for a copper film.

When forming a damascene conductive part by forming such a thick copper film, the amount of copper to be removed by polishing during one CMP step increases, so that a large amount of polishing scrape such as a copper or copper oxide adheres to and is accumulated on the surface of a polishing pad. As a result, a polishing rate may become too low continue polishing or a polished surface cannot be uniform. It is now needed to make a wafer larger for improving a productivity. However, as a wafer becomes larger, an area of a copper film increases, and therefore the amount of copper to be removed by polishing has been increasing. Polishing scrapes, such as copper or copper oxide generated during polishing a copper metal film is herein designated a "polishing product".

A surface plate in a CMP apparatus cannot be so large in the light of factors such as ensuring in-plane uniformity of the surface plate, even diffusivity of a dropped polishing slurry, limitation in an area where the CMP apparatus is placed, workability in replacing a polishing pad and ensuring cleanliness in a clean room.

Increase of the amount of polished copper reduces a throughput at the same polishing rate as that for a thinner film. It is, therefore, necessary to increase a polishing rate for copper. Increase of a polishing rate for copper, however, leads to a large amount of polishing product in a short time, so that adhesion of copper to the surface of the polishing pad becomes more significant.

When a large amount of polishing product adheres to the surface of the polishing pad as described above, the polishing pad must be washed or replaced after every polishing, and furthermore, polishing must be repeated after washing or replacing the polishing pad, resulting in significant reduction in a throughput.

When a contact pressure (polishing pressure) of the polishing pad relative to the polished surface is increased for increasing a polishing rate and improving uniformity in the polished surface, adhesion of the polishing product to the surface of the polishing pad may cause inadequate in-plane uniformity in the polished surface as well as may enhance adhesion of the polishing product to the surface of the polishing pad.

JP-A 10-116804 has demonstrated the problem that copper ions generated during CMP are accumulated on a polishing pad and again adhere to a wafer surface to deteriorate uniformity of the wafer surface and cause electric short-circuit, and has described that the problem can be solved by using a polishing composition comprising a re-adhesion inhibitor such as benzotriazole in CMP. The publication has mentioned the problem due to re-adhesion of copper ions on the wafer surface, but there are no descriptions for the above due to adhesion of a polishing product to a pad surface. Benzotriazole used as a re-adhesion inhibitor may act as an antioxidant (J. B. Cotton, Proc. 2nd Intern. Congr. Metallic Corrosion, (1963) p.590; D. Chadwick et al., Corrosion Sci., 18, (1978) p.39; T. Notodani, Bousei Kanri, 26(3) (1982), p.74; H. Okabe ed., "Sekiyu Seihin Tenkazai no Kaihatsu to Saishin Gijutsu" (1998), CMC, p.77–82), there is a limitation to the amount of the agent for reducing a polishing rate for copper. Furthermore, benzotriazole is originally added for preventing dishing (JP-As 8-83780 and 11-238709). When prevention of dishing is given priority, the amount of the agent is limited.

JP-A 10-46140 has described a polishing composition comprising a particular carboxylic acid, an oxidizing agent and water whose pH is adjusted by an alkali to 5 to 9. Examples in the publication have disclosed a polishing composition containing citric acid as a carboxylic acid and aluminum oxide as a polishing material (Example 7). However, this publication has described only improvement in a polishing rate and prevention of occurring dishing associated with a corrosion mark as an effect of addition of a carboxylic acid such as citric acid.

JP-A 11-21546 has disclosed a polishing process using a slurry for chemical mechanical polishing comprising urea, a polishing material, an oxidizing agent, a film-forming agent and a complex-forming agent. Examples in this publication have described alumina as a polishing material, hydrogen peroxide as an oxidizing agent, benzotriazole as a film-forming agent and citric acid as a complex-forming agent. The publication, however, has described only that addition of the complex-forming agent is effective for disturbing a passive layer formed by a film-forming agent such as benzotriazole and for limiting a depth of an oxidizing layer.

JP-A 10-44047 has described that polishing grains may be aggregates of a metal oxide with a size distribution of less than about 1.0 μm and an average aggregate diameter of less than about 0.4 μm, or separate spherical particles of a metal oxide comprising primary particles of less than 0.4 μm. Objectives of the invention described in the publication are, however, to prevent surface defects or contamination due to CMP, to form a uniform metal layer and a uniform film, and to control selectivity between a barrier film and an insulating film. There are no descriptions about problems caused by adhesion of a polishing product to a polishing pad surface in the publication. In addition, the publication has listed common precipitated alumina or fumed alumina as an alumina polishing material, but has not mentioned θ-alumina at all. Furthermore, copper is listed only as a connection material and in its examples, only Al is used.

JP-A 10-163141 has described θ-alumina as polishing grains. This publication, however, has described θ-alumina as an example of an aluminum oxide together with other aluminas such as α-alumina, but has not mentioned secondary particles of θ-alumina at all. The invention described in the publication is for preventing scratches or dishing and for providing a polishing composition with a proper selectivity and exhibiting good storage stability, and there are no descriptions about preventing adhesion of a polishing product to a, polishing pad surface.

SUMMARY OF THE INVENTION

An objective of this invention is to provide a process for forming a metal interconnect, which can prevent adhesion of a polishing product to a polishing pad and form a uniform interconnect layer with an improved throughput, even when polishing a large amount of copper-containing metal during a polishing step.

This invention provides a process for forming a metal interconnect comprising the steps of forming a concave in an insulating film formed on a substrate, forming a copper-containing metal film over the whole surface such that the concave is filled with the metal and then polishing the copper-containing metal film by chemical mechanical polishing, characterized in that the polishing step is conducted using a chemical mechanical polishing slurry comprising a polishing material, an oxidizing agent and an adhesion inhibitor preventing adhesion of a polishing product to a polishing pad, while contacting the polishing pad to a polished surface with a pressure of at least 27 kPa.

This invention also provides a process for forming a metal interconnect comprising the steps of forming a concave in an insulating film formed on a substrate, forming a copper-containing metal film over the whole surface such that the concave is filled with the metal and then polishing the copper-containing metal film by chemical mechanical polishing, characterized in that the polishing step is conducted using a chemical mechanical polishing slurry comprising θ-alumina mainly containing secondary particles made of aggregated primary particles as a polishing material, an oxidizing agent and an organic acid, while contacting the polishing pad to a polished surface with a pressure of at least 27 kPa.

As used herein, the term "a copper-containing metal" means copper or an alloy mainly containing copper, and the term "a concave" means a groove for forming a damascene interconnect or a connection hole such as a contact hole and a through hole. The term "an insulating film formed on a substrate" includes an interlayer insulating film formed on a lower interconnect layer.

This invention allows us to prevent adhesion of a polishing product to a polishing pad and to form a uniform interconnect layer with an improved throughput, even when polishing a large amount of copper-containing metal during a polishing step.

DETAILED DESCRIPTION OF PREFERRED EMBODIMENTS

Figure 1:
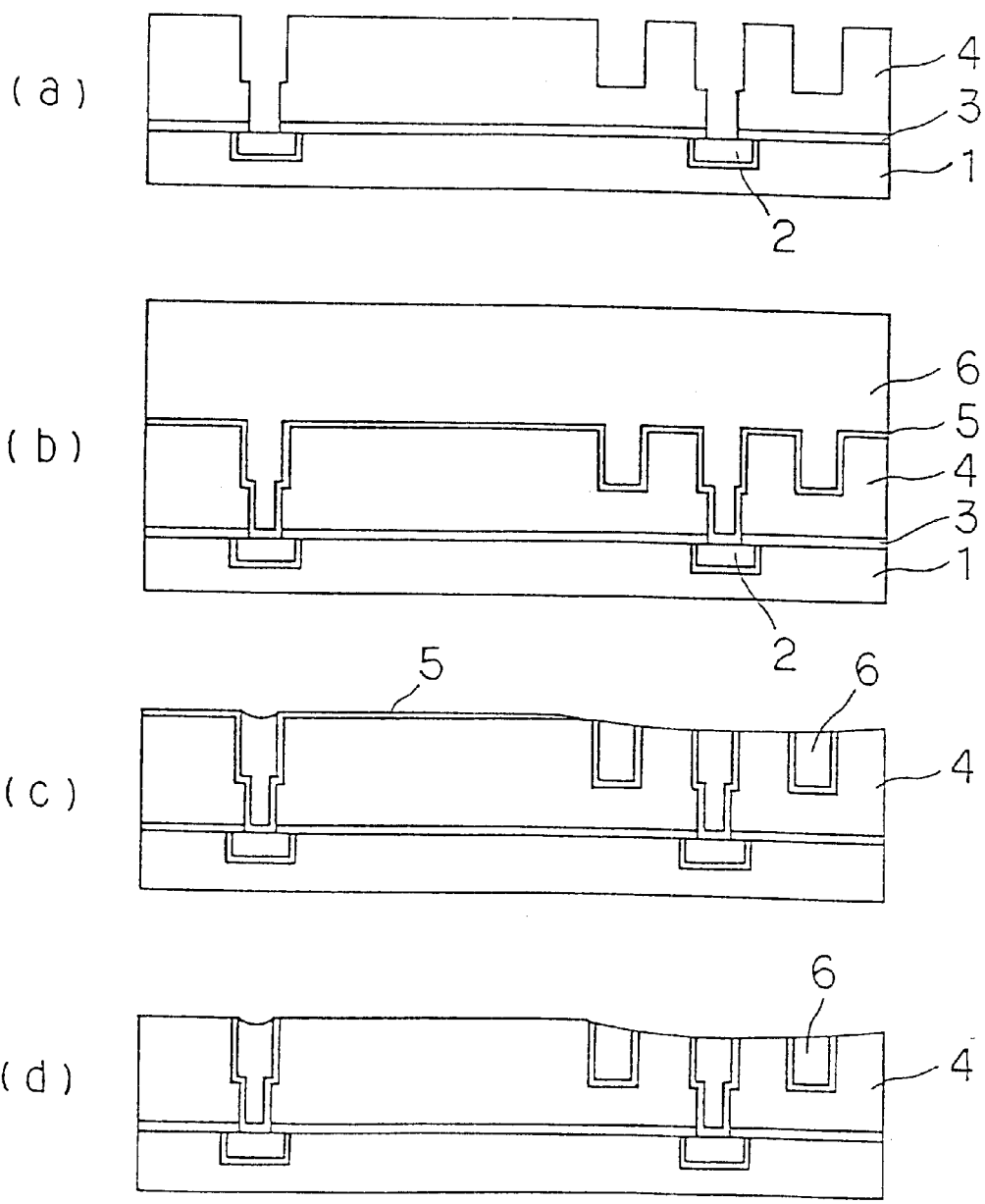
FIG. 1 is a process cross section illustrating a prior art process for forming a damascene copper interconnect.

Preferred embodiments of this invention will be described.

The polishing step in the process for forming a metal interconnect is conducted using a chemical mechanical polishing slurry (hereinafter, referred to as a "polishing slurry") comprising citric acid as an adhesion inhibitor preventing adhesion of a polishing product to a polishing pad or θ-alumina mainly containing secondary particles made of primary particles as a polishing material (hereinafter, referred to as "secondary-particle containing θ-alumina"). CMP using such a polishing slurry allows us to prevent adhesion of a polishing product to a polishing pad and to continue satisfactory polishing without discontinuing polishing operation, even when polishing a thick or large copper-containing metal film, i.e., when polishing a large amount of copper-containing metal during one polishing operation. Furthermore, adhesion of a polishing product to a polishing pad may be inhibited. Therefore, a contact pressure of the polishing pad to a polished surface may be increased to increase a polishing rate as well as to adequately improve in-plane uniformity of the polished surface. As a result, there may be provided a uniform interconnect with a small dispersion of its resistance.

In a chemical mechanical polishing slurry, a carboxylic acid, an organic acid, has been used as a proton donor for improving a polishing rate, and citric acid has been known only as a kind of such a carboxylic acid. We have conducted intense investigation for solving the above problems and have found that adhesion of a polishing product to a polishing pad may be prevented by adding citric acid in a polishing slurry, to achieve this invention.

In a chemical mechanical polishing slurry for polishing a copper-containing metal film, α-alumina consisting of primary particles is generally used as alumina as a polishing material. We have investigated, among various aluminas, θ-alumina and have found that particular θ-alumina mainly comprising secondary particles may be used as a polishing material to prevent adhesion of a polishing product to a polishing pad, and finally to achieve this invention.

CMP in this invention using the above polishing slurry may satisfactorily polish a substrate on which a copper-containing metal film is formed without pad contamination, even when polishing the copper-containing metal with a polishing amount of $2 \times 10^{-4}$ g/cm$^2$ or more, more preferably $1 \times 10^{-3}$ g/cm$^2$ or more, and most preferably $1 \times 10^{-2}$ cm$^2$ or more per unit area of the polishing pad on one polishing pad in one polishing operation. For example, when forming a damascene conductive part in which the sum of an interconnection thickness and a depth of a connection hole is about 1.5μm, in forming an upper interconnect in a multilayer interconnect structure, it is necessary to form a copper film with a thickness of about 2.0μm or more, resulting in a large amount of copper film per unit area of the polishing pad.

A polishing pad used in polishing such a large amount of copper metal may be one made of a common porous urethane resin.

A polishing slurry used in this invention comprises, as a basic composition, a polishing material, an oxidizing agent, an organic acid and water. In this basic composition, the slurry comprises citric acid to be an adhesion inhibitor as an organic acid θ-alumina mainly containing secondary particles made of aggregated primary particles (secondary-particle containing θ-alumina) as a polishing material. In this basic composition, the slurry may comprise both citric acid and secondary-particle containing θ-alumina as a polishing material. An antioxidant may be further present for preventing dishing or controlling a polishing rate.

The content of citric acid in the polishing slurry used in this invention is preferably at least 0.01 w %, more preferably at least 0.05 wt % relative to the total amount of the slurry composition for achieving adequate adhesion-inhibiting effect, and is preferably 5 wt % or less, more preferably 3 wt % or less in light of, e.g., the thixotropic nature of the polishing slurry.

In CMP using a polishing slurry containing citric acid, a polishing waste was bluish green. It may indicate that there would be formed a complex of copper ion eluted due to ionization by the action of the oxidizing agent with citric acid in the polishing slurry to prevent a copper compound from adhering to a polishing pad or polished surface as a polishing product, resulting in discharge of the copper component removed by polishing.

The content of secondary particles in the secondary-particle containing θ-alumina is preferably at least 60 wt %, more preferably at least 65 wt %, and most preferably at least 70 wt % to the total amount of the secondary-particle containing θ-alumina for more completely preventing adhesion of a polishing product to a polishing pad.

An average particle size (diameter) of the secondary particles is preferably at least 0.05 μm, more preferably at least 0.07 μm and most perferably at least 0.08 μm. As its upper limit it is preferably 0.5 μm or less, more preferably 0.4 μm or less, most preferably 0.3 μm or less.

The amount of secondary particles with a particle size of 0.05 μm to 0.5 μm inclusive in the total amount of secondary-particle θ-alumina present is preferably at least 50 wt %, more preferably at least 55 wt %, and most preferably at least 60 wt %.

In addition, it is desirable that secondary-particle containing θ-alumina substantially contains neither primary nor secondary particles having a particle size of more than 2 μm, more preferably more than 1.5 μm, and most preferably more than 1 μm.

An average particle size of primart particles constituting secondary-particle θ-alumina described above is preferably at least 0.005 μm, more preferably at least 0.007 μm, and most preferably at least 0.008 μm. As an upper limit it is preferably 0.1 μm or less, more preferably 0.09 μm or less, and most preferably 0.08 μm or less.

An average particle size of primary particles constituting secondary-particle containing θ-alumina in this invention is considerably smaller that of primary particles of α-alumina commonly used as conventional polishing grains. An average particle of secondary particles consisting of such primary particles may be, therefore, adjusted to about that of primary particles of the conventional α-alumina. When conducting CMP using a polishing slurry comprising such θ-alumina mainly containing the secondary particles (secondary-particle containing θ-alumina) as a main component in polishing grains, the polishing product generated after mechanical removal is small because the contact area is small between a polished surface of copper and a primary particle constituting a secondary particle. Furthermore, the polishing prosuct generated is further pulverized to provide a finer polishing product having spaces between primary particles constituting secondary particles or an irregular surface.

Secondary-particle containing θ-alumina has a larger surface area than a primary particle of a conventional α-alumina. It, therefore, exhibits good dispersibility, which may prevent forming a giant particle due to association of secondary particles. Thus, it may prevent generation of a large size polishing product from a polished surface due to scratching by a giant particle.

As described above, in CMP using a polishing slurry comprising secondary-particle containing θ-alumina, a polishing product generated is so small that clogging with the polishing product can be minimized in the polishing pad surface while a fine polishing product can be readily washed out by the polishing slurry which is continuously fed. Thus, polishing pad contamination can be prevented even when a large amount of copper is removed by polishing.

In CMP using the above polishing slurry, scratches in a polished surface may be prevented in addition to the effect of inhibiting polishing pad contamination. Since secondary-particle containing θ-alumina can be deformed by a polishing load from a polishing pad, stress concentration can be avoided in a contact area between the polished surface amd a primary constituting a secondary particle. Consequently, the polished surfacemay not be significantly removed and thus may prevent scratches.

θ-alumina has a Mohs' hardness of 7 while α-alumina has 9. In other words, θ-alumina has a lower hardness than α-alumina, and has a proper hardness for polishing a soft metal such as copper, leading to prevention of scratches.

Furthermore, a secondary particle in secondary-particle containing θ-alumina has a large surface area and thus exhibits good dispersibility, and a primary particle is extremely small. The polishing slurry used in this invention, therefore, has a property of good long term stability.

An average particle size of polishing grains, a proportion of grains having a particular range of particle size and a maximum particle size may be estimated by determining a particle size distribution of polishing grains by a light scattering method and statistically processing the particle size distribution obtained. Furthermore, a particle size distribution of polishing grains may be determined by measuring a particle size for an adequately large number of polishing grains using an electron microscope.

θ-alumina may be prepared by removing crystal water from a colloid made of an Al-containing salt hydrate or hydroxide by heating under controlling a programming rate. A secondary particle is an aggregate formed by fusion of contact parts in primary particles during heating. Since it is possible to prepare fine colloid particles whose particle size is controlled in preparation of θ-alumina, fine primary particles having an average particle size and a particle size distribution suitable to this invention may be prepared. It may, therefore, allow us to form secondary particles of θ-alumina having a similar particle size to primary particles of conventional α-alumina. Furthermore, since a binding strength of fusion between primary particles formed during heating is within a proper range, dispersion under appropriate conditions may break a bond between several primary particles to form secondary particles with a particle size suitable to this invention.

Secondary-particle containing θ-alumina used in this invention may be prepared by dispersing θ-alumina prepared as described above into a dispersive medium under appropriate conditions. θ-alumina prepared by heating a colloid consists of giant aggregates with an average particle size of about 10 μm, consisting of a number of fused primary particles. It is added to an aqueous medium within a range of 10 wt % to 70 wt % both inclusive. A dispersing agent may be, if necessary, added within a range of 0.01 wt % to 10 wt %. The amounts of θ-alumina and the dispersing agent affect a particle size of secondary particles obtained.

Dispersion may be conducted using, for example, an ultrasonic disperser, a bead mill disperser, a ball mill disperser or a kneader disperser. Among these, a bead mill or ball mill disperser may be preferably used because it may stably form secondary particles with a desirable particle size. Furthermore, a filter mechanism may be provided to the disperser for removing particles with a particle size of more than 2 μm.

A dispersion time, which effects a secondary particle size distribution, is preferably at least 140 min, more preably at least 150 min, and most preferably at least 180 min for providing secondary particles with a highly monodisperse particle size distribution. In the light of preventing contamination with foreign matters, as its uppers limit it is preferably 400 min or less, more preferably 350 min or less, and most preferably 300 min or less.

A dispersing agent may consist of at least one of surfactant and aqueous polymer types of dispersing agents.

Examples of surfactant dispersing agents include anionic, cationic, ampholytic and nonionic surfactants. Anionic surfactants which may be used include soluble salts of sulfonic acids, sulfates, carboxylic acids, phosphates and phosphonic acids; for example, sodium alkylbenzenesulfonate (ABS), sodium dodecylsulfate (SDS), sodium stearate and sodium hexamethaphosphate. Cationic surfactants include amine salts containing a salt-forming primary, secondary or tertiary amine and their modified salts; onium compounds such as quaternary ammonium, phosphonium and sulfonium salts; circular nitrogen-containing compounds such as pyridinium, quinolinium and imidazolinium salts; and heterocyclic compounds; for example, cetyl-trimethyl-ammonium chloride (CTAC), cetyl-trimethyl-ammonium bromide (CTAB), cetylpyridinium chloride, dodecylpyridinium chloride, alkyl-dimethylchlorobenzyl-ammonium chloride and alkyl-naphthalene-pyridinium chloride.

Nonionic surfactants include products of addition polymerization of a fatty acid with ethylene oxide such as polyethyleneglycol fatty acid esters, polyoxyethylene alkyl ethers, polyoxyethylene alkylphenyl ethers; ether types of nonionic surfactants; and polyethyleneglycol condensation types of surfactants; for example, POE (10) monolaurate, POE (10) monostearate, POE (25) monostearate, POE (40) monostearate, POE (45) monostearate, POE (55) monostearate, POE(21) lauryl ether, POE(25) lauryl ether, POE(15) cetyl ether, POE(20) cetyl ether, POE(23) cetyl ether, POE(25) cetyl ether, POE(30) cetyl ether, POE(40) cetyl ether, POE(20) stearyl ether, POE(2) nonyl phenyl ether, POE(3) nonyl phenyl ether, POE(2) nonyl phenyl ether, POE(7) nonyl phenyl ether, POE(10) nonyl phenyl ether, POE(15) nonyl phenyl ether, POE(18) nonyl phenyl ether, POE(20) nonyl phenyl ether, POE(10) octyl phenyl ether, POE(30) octyl phenyl ether, POE(6) sorbitan monooleate, POE(20) sorbitan monooleate, POE(6) sorbitan 20 monolaurate, POE(20) sorbitan monolaurate, POE(20) sorbitan monopalmitate, POE(6) sorbitan monostearate, POE(20) sorbitan monostearate, POE(20) sorbitan tristearate, POE(20) sorbitan trioleate, POE(6) sorbitan monooleate and POE(20) sorbitan monooleate, wherein POE represents polyoxyethylene and a number in parentheses is the number of the repeating unit —$CH_2CH_2O$—.

Amphoteric surfactants which may be used include compounds intramolecularly having at least one anoin-forming atomic group selected from –COOH, –$SO^3H$, –$OSO_3H$ and –$OPO_3H_2$ groups and cation-forming atomic group selected from primary, secondary and tertiary amine groups and quaternary ammonium groups; for example, betaines and sulfobetaines and sulfatebetaines; more specifically, lauryl dimethylaminoacetate betaine and sodium N-acyl-palm oil fatty acid-N-carboxymethyl-N-hydroxyethylenediamine.

Aqueous polymer dispersing agents include ionic and nonionic polymers. Ionic polymers include alginic acid and its salts, polyacrylic acid and its salts, a polycarboxylic acid and its salts, cellulose, carboxymethylcellulose and hydroxylethylcellulose. Nonionic polymers include polyvinyl alcohol, polyvinylpyrrolidone, polyethylene glycol and polyacrylamide.

A weight-average molecular weight of an aqueous polymer dispersing agent is preferably at least 100, more preferably at least 500, further preferably at least 1000. As its upper limit it is preferably 100000 or less, more preferably 80000 or less, and most preferably 50000 or less. A weight-average molecular weight within the range may inhibit increase in a viscosity of a slurry obtained to provide secondary-particles with a good particle size distribution.

As long as it does not adversely affect the effects of secondary-particle containing θ-alumina, additional polishing grains may be used, which include aluminas such as α-alumina and δ-alumina other than θ-alumina; silicas such as fumed silica and colloidal silica; titania; zirconia; germania; ceria; and a mixtures of two or more selected from these metal oxide polishing grains.

The content of secondary-particle containing θ-alumina is preferably at least 1 wt %, and more preferably at least 3 wt % to the total amount of the chemical mechanical polishing slurry. As its upper limit it is 30 wt % or less, and more preferably 10 wt % or less. When the polishing slurry contains two or more types of polishing grains, the sum of the contents of individual polishing grains is preferably at least 1 wt %, and more preferably at least 3 wt %, and as its upper limit it is preferably 30 wt % or less, and more preferably 10 wt % or less.

When using a polishing slurry comprising citric acid in this invention, a polishing material may be, instead of the above secondary-particle containing θ-alumina, aluminas such as commonly used α-alumina, θ-alumina and δ-alumina; silicas such as fumed silica and colloidal silica; titania; zirconia; germania; ceria; and a combination of two or more selected from these metal oxide polishing grains. An average particle size of such a polishing material is preferable at least 5 nm, and more preferably at least 50 nm, and also at most preferably 500 nm or less, and more preferably 300 nm or less as determined by a light scattering diffraction technique, in light of a polishing rate, dispersion stability and surface roughness of a polished surface. A particle size distribution is preferably 3 μm or less, more preferably 1 μm or less for the maxium particle size (d100).

The content of a polishing material in a polishing slurry may be appropriately selected within the range of 0.1 to 50 wt % to the total amount of the slurry composition in light of factors such as a polishing efficiency and polishing accuracy. It is preferably at least 1 wt %, more preferably at least 2 wt %, at most preferably at least 3 wt %, and as its upper limit it is preferably 30 wt % or less, more preferably 10 wt % or less, and most preferably 8 wt % or less.

In light of the polishing rate and corrosion, the slurry viscosity and the dispersion stability of a polishing material, a polishing slurry used in this invention has a pH of preferably at least 4, and more preferably at least 5. It has preferably a pH of 8 or less and more preferably 7 or less. Too high a pH may cause dissociation of citric acid which leads to reduction in its complex-forming capacity with a polishing product and its adhesion-inhibiting effect, so that the polishing tends to adhere to a polishing pad. On the other hand, too low a pH excessivley increase a polishing rate for copper, leading to deterioration in a surface shape of a copper interconnect, i.e., a recession, which may often cause a step.

For the polishing slurry, the pH may be adjusted by a known technique. For example, an alkali may be directly added to a slurry in which polishing grains are dispersed and a carboxylic acid is dissolved. Alternatively, a part or all of an alkali to be added may be added as a carboxylic acid alkali salt. Examples of an alkali which may be used include alkali metal hydroxides such as sodium hydroxide and potassium hydoxide; alkali metal carbonates such as sodium carbonate and potassium carbonate; ammonia; and amines.

The oxidizing agent may be appropriately selected from known water-soluble oxidizing agents taking into consideration the type of a conductive metal film, polishing accuracy and a polishing efficiency. For example, those which may not cause heavy-metal ion contamination include peroxides such as $H_2)_2$, $Na_2O_2$, $Ba_2O_2$ and $(C_6H_5C)_2O_2$; hypochlorous acid (HClO); perchloric acid; nitric acid; ozone water; and organic acid peroxides such as peracetic acid and nitrobenzene. Among these, hydrogen peroxide ($H_2O_2$) is preferable because it does not contain a metal component and does not generate a harmful byproduct. The content of the oxidizing agent in the polishing slurry used in this invention is preferably at least 0.01 wt %, more preferably at least 0.05 wt %, and most preferably at least 0.1 wt % for achieving adequate effects of its addition whil eit is preferably 15 wt % or less, and more preferably 10 wt % or less for preventing dishing and adjusting a polishing rate to a proper value. When using an oxidizing agent which is relatively susceptible to deterioration with age such as hydrogen peroxide, it may be possible to separately prepare a solution containing an oxidizing agent at a given concentration and a composition which provides a given polishing slurry after addition of the solution containing an oxidizing agent, which are then combined just before use.

A known carboxylic acid or amino acid may be added as a proton donor for enhancing oxidization by the oxidizing agent and achieving stable polishing. Although citric acid which is a carboxylic acid may act as such a proton donor, a different organic acid such as a carboxylic acid and an amino acid may be added.

Carboxylic acids other than citric acid include formic acid, acetic acid, propionic acid, butyric acid, valeric acid, acrylic acid, lactic acid, succinic acid, nicotinic acid, oxalic acid, malonic acid, tartaric acid, malic acid, glutaric acid, citric acid, maleic acid and their salts.

An amino acid may be added as such, as a salt or as a hydrate. Examples of those which may be added include arginine, arginine hydrochloride, arginine picrate, arginine flavianate, lysine, lysine hydrochloride, lysine dihydrochloride, lysine picrate, histidine, histidine hydrochloride, histidine dihydrochloride, glutamic acid, glutamic acid hydrochloride, sodium glutaminate monohydrate, glutamine, glutathione, glycylglycine, alanine, β-alanine, γ-aminobutyric acid, ε-aminocarproic acid, aspartic acid, aspartic acid monohydrate, potassium aspartate, potassium aspartate trihydrate, tryptophan, threonine, glycine, cystine, cysteine, cysteine hydrochloride monohydrate, oxyproline, isoleucine, leucine, methionine, ornithine hydrochloride, phenylalanine, phenylglycine, proline, serine, tyrosine, valine, and a mixture of these amino acids.

The content of the organic acid preferably at least 0.01 wt %, and more preferably at least 0.05 wt % relative to the total amount of the polishing slurry for achieving adequate effects of its addition, while it is preferably 5 wt % or less, more preferably 3 wt % or less as a content including citric acid for preventing dishing and adjusting a polishing rate to a proper value.

An antioxidant may be further added to a polishing slurry in this invention. Addition of an antioxidant may allow a polishing rate for a copper-containing metal film to be easily adjusted and may result in forming a coating film over the surface of the copper-containing metal film to prevent deterioration in the surface shape of the copper-containing interconnect due to chemical polishing, i.e., dishing and recession.

Examples of an antioxidant include benzotriazole, 1,2,4-triazole, benzofuroxan, 2,1,3-benzothiazole, o-phenylenediamine, m-phenylenediamine, cathechol, o-aminophenol, 2-mercaptobenzothiazole, 2-mercaptobenzimidazole, 2-mercaptobenzoxazole, melamine, and their derivatives. Among these, benzotriazole and its derivatives are preferable. Examples of a benzotriazole derivative include substituted benzotriazoles having a benzene ring substituted with hydroxy; alkoxy such as methoxy and ethoxy; amino; nitro; alkyl such as methyl, ethyl and butyl; halogen such as fluorine, chlorine, bromine and iodine. Furthermore, naphthalenetriazole and naphthalenebistriazole as well as substituted naphthalenetriazoles and substituted naphthalenebistriazoles substituted as described above may be used.

The content of the antioxidant is preferably at least 0.0001 wt % and more preferably at least 0.001 wt % relative to the total amount of the polishing slurry for achieving adequate effects of its addition, while it is preferably 5.0 wt % or less, and more preferably 2.5 wt % or less for adjusting a polishing rate to a proper value. An excessive amount of antioxidant may be excessively anti-corrosive and thus a polishing rate for copper-containing metal may be excessively reduced, leading to a longer CMP time.

A polishing slurry used in this invention may contain a variety of additives such as dispersing agents, buffers and viscosity modifiers commonly added to a polishing slurry as long as it does not deteriorate the properties of the slurry.

A composition of the polishing slurry used in this invention is preferably adjusted such that a polishing rate for a copper-containing metal film becomes preferably at least 300 nm/min and more preferably at least 400 nm/min. Futhermore, a composition of polishing slurry used in this invention is preferably adjusted such that a polishing rate for a copper metal film becomes preferably 1500 nm/min or less, and more preferably 1000 nm/min or less.

A polishing slurry used in this invention may be prepared by a common process for preparing a free grain polishing slurry. Specifically, polishing grain particles are added to a dispersion medium to an appropriate amount. A protective agent may be, if necessary, added to an appropriate amount. In such a state, air is strongly adsorbed in the surface of the grain particles, so that the grains are aggregated due to poor wettability. Thus, the aggregated polishing material particles are dispersed into primary particles. In a dispersion process, a dispersion technique and a dispersion apparatus commonly used may be employed. Specifically, dispersion may be conducted using an apparatus such as an ultrasonic disperser, a variety of bead mill dispersers, a kneader and a ball mill by a known process. Citric acid may cause flocculation of polishing grains while enhancing thixotropy. It is, therefore, preferable to add and mix the component after dispersion for achieving good dispersion.

Figure 2:
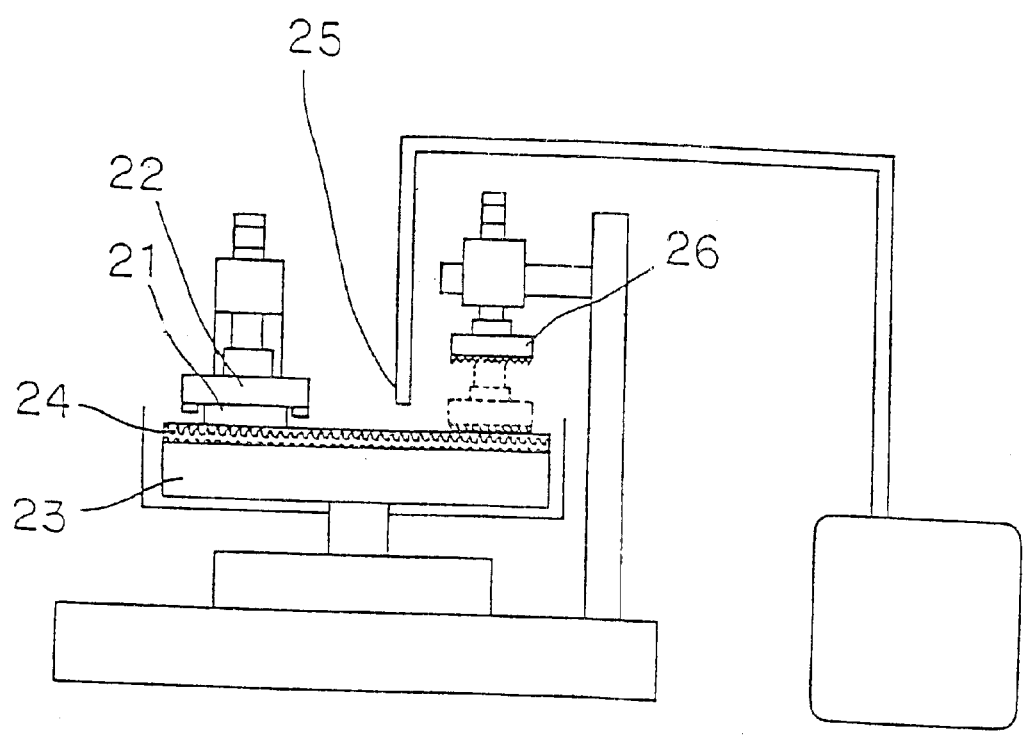
FIG. 2 is a schematic configuration of a chemical mechanical polishing apparatus.
Figure 3:
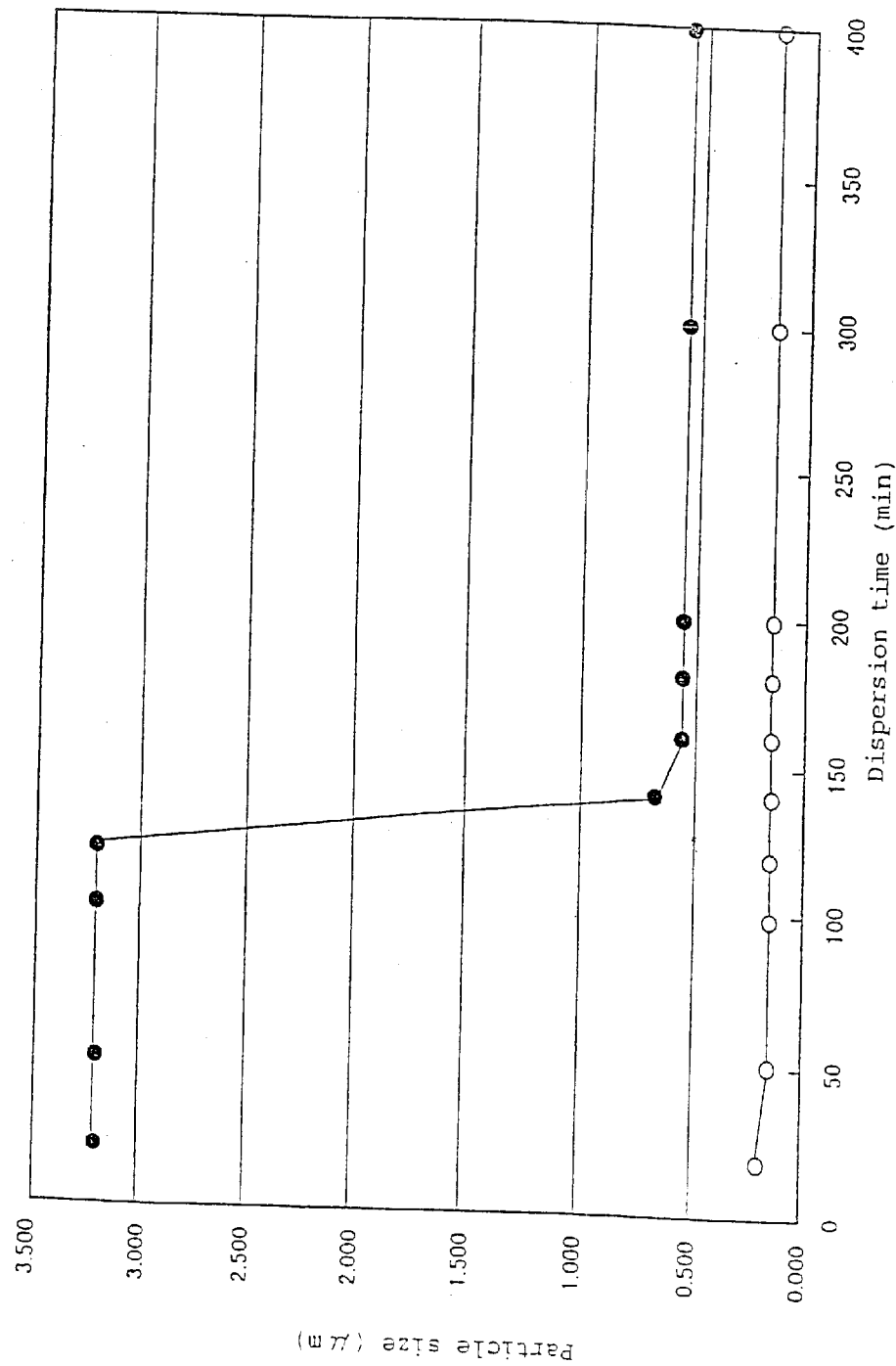
FIG. 3 shows variation in a particle size of θ-alumina plotted to a dispersion time.

Polishing in this invention may be conducted using, for example, a common chemical mechanical polishing apparatus (CMP apparatus) as shown in FIG. 2.

A wafer 21 in which, for example, an insulating film and a copper-containing metal film are deposited on a substrate is placed on a spindle wafer carrier 22. The surface of the wafer 21 is contacted with a polishing pad 24 adhered on a rotary plate (surface plate) 23. While supplying a polishing slurry to the surface of the polishing pad 24 from a polishing slurry inlet 25, both the wafer 21 and the polishing pad 24 are rotated to polish the wafer. If necessary, a pad conditioner 26 is contacted with the surface of the polishing pad 24 to condition the surface of the polishing pad. The polishing slurry may be fed to the surface of the polishing pad 24 from the side of the rotary plate 23.

In this invention, a contact pressure of the polishing pad to the polishing surface during CMP is 27 kPa or more, preferably 34 kPa or more. Increase in the contact pressure of the polishing pad may prevent bending of the polishing pad to improve in-plane uniformity of the polished surface, leading to reduction in a dispersion in the height of the interconnect and thus reduction in a dispersion in an interconnect resistance. Furthermore, in-plane uniformity may be improved and a polishing rate may be increased, so that a throughput may be improved. Even in high-speed polishing, the content of an oxidizing agent such as hydrogen peroxide in the polishing slurry may be adjusted within a range where stable polishing can be conducted with improved handling properties. There are no restrictions to an upper limit of the contact pressure (polishing pressure) of the polishing pad to the polished surface, but it may be preferably 48.3 kPa (7 psi) or less for ensuring adequate contact between a wafer and the polishing pad and feeding a polishing slurry between the wafer and the polishing pad in the light of a polishing rate and in-plane uniformity of the polished surface.

For other CMP conditions, for example, the followings may be selected when using a polishing pad slightly larger than a wafer (a polishing pad having a radius smaller than a wafer diameter): a retainer pressure: 25.2 kPa (3.65 psi) to 27.9 kPa (4.05 psi); a rotating speed of the surface plate: 260 to 280 rpm; and a feeding rate of the polishing slurry: 80 to 150 mL/min. When using a polishing pad having a radius larger than a wafer diameter, the following may be selected: a rotating speed of the surface plate: 30 to 100 rpm; and a feeding rate of the polishing slurry: 100 to 300 mL/min.

Now, a wafer size (diameter) is predominantly 6 or 8 inch, but according to this invention, adhesion of a polishing product to a polishing pad may be prevented for a wafer having a diameter of 12 inch or more, leading to satisfactory CMP.

This invention described above may be suitably applied to a process for forming an electric connection part such as a damascene interconnect, a via plug and a contact plug by CMP of a substrate where a barrier metal film is formed on an insulating film having a concave such as a groove and a connection hole and a copper metal film is formed over the whole surface such that the concave is filled with the metal, until the surface of the insulating film is substantially completely exposed. Examples of a barrier metal include Ta, TaN, Ti, TiN, W, WN and WSiN. Examples of an insulating film include a silicon oxide film, a BPSG film and an SOG film. Examples of a copper-containing metal film include a copper film as well as a copper alloy film comprising a metal selected from a variety of conductive metals such as silver, gold, platinum, titanium, tungsten, aluminum.

This invention described above can prevent adhesion of a polishing product to a polishing pad and thus can eliminate necessity of washing a pad surface, even when a large amount of copper-containing metal must be removed by polishing because of a thick or large copper-containing metal film. A large amount of copper-containing metal may be, therefore, satisfactorily subject to CMP in one polishing step without discontinuing polishing operation.

In addition to eliminating the necessity of washing the surface of the polishing pad, a conditioning time may be reduced, leading to a longer life of the polishing pad.

Furthermore, according to this invention, adhesion of a polishing product to a polishing pad can be inhibited. Therefore, a contact pressure of the polishing pad to a polished surface may be increased to increase a polishing rate as well as to adequately improve in-plane uniformity of the polished surface. Consequently a dispersion of a interconnect height may be reduced and thus there may be provided a uniform interconnect with a small dispersion of its resistance.

According to this invention, since adhesion of a polishing product may be prevented not only on a polishing pad surface but also on a polished surface during polishing, an excellent polished surface may be formed without problems of device properties such as electric short-circuit between interconnects, and also an excellent polished surface having good in-plane uniformity may be formed to prevent dishing and erosion.

EXAMPLES

This invention will be more specifically described with reference to examples.

CMP conditions

CMP was conducted using a Speedfam-Ipec Type SH-24 apparatus. The polisher was used, on whose surface plate a polishing pad (Rodel-Nitta IC 1400) with a diameter of 61 cm (24 inch) was attached. Polishing conditions were as follows: a contact pressure of the polishing pad: 27.6 kPa (4 psi); a polishing area of the polishing pad: 1820 cm; a rotating speed of the surface plate: 55 rpm; a carrier rotating speed: 55 rpm; and a polishing slurry feeding rate: 100 mL/min.

Determination of a polishing rate

A polishing rate was calculated from surface resistivities before and after processing. Specifically, four needle electrodes were aligned on a wafer with a given interval. A given current was applied between the outer two probes to detect a potential difference between two inner probes for determining a resistance (R') and further the value is multiplied by a correction factor RCF (Resistivity Correction Factor) to a surface resistivity ($\rho s'$). A surface resistivity ($\rho s$) is determined for a wafer film whose thickness (T) (nm) is known. The surface resistivity is inversely proportional to the thickness. Thus, when a thickness for a surface resistivity of $\rho$'s is d, an equation $d(nm)=(\rho s \times T)/\rho s'$ holds true. Using the equation, the thickness d can be determined. Furthermore, a variation between before and after polishing was divided by a polishing time to estimate a polishing rate. A surface resistivity was determined using Mitsubishi Chemical Industries Four Probe Resistance Detector (Lorest-GP).

Evaluation of In-Plane Uniformity of a Polished Surface

Surface resistivities (specific resistances) before and after polishing were measured at 40 points in the wafer surface to determine a k value for distribution in an absolute polishing amount, which was then used as an indication for in-plane uniformity.

A measured surface resistance at each point in the wafer surface was used to determine a thickness of the copper film at each point, and a film thickness after polishing was subtracted from that before polishing to determine a polishing amount for each point. Then, the maximum $P_{max}$, the minimum $P_{min}$ and an average $P_{av}$ in 40 points were determined, and these values were used to calculate an in-plane uniformity rate k $(\%)=(P_{max}-P_{min})\times100/(2\times P_{av})$.

Example 1

A copper damascene interconnect comprising a Ta film as a barrier metal film was prepared.

As shown in FIG. 1(a), on a 6 inch wafer (silicon substrate, not shown) in which a semiconductor device such as a transistor was formed was deposited a first silicon oxide film 1 comprising a lower interconnect 2 (not shown). On the film 1 were formed a silicon nitride film 3 and a second silicon oxide film 4 with a thickness of about 1.5, $\mu$m. The second silicon oxide film 4 was then patterned as usual by, for example, photolithography and reactive ion etching to form a groove for interconnection and in a given area of the groove a connection hole reaching the lower interconnect 2. Then, Ta film with a thickness of 50 nm was formed by sputtering, a copper film with a thickness of about 50 nm was formed by sputtering, and then a copper film 6 with a thickness of about 2.0 $\mu$m was formed by plating.

The substrate thus prepared was subjected to CMP using various polishing slurries shown in Table 1, and contamination in a polishing pad after polishing the copper film to about 2$\mu$m was evaluated visually or on the basis of a polishing rate.

Citric acid, glutaric acid, glycine and benzotriazole (BTA) were obtained from Kanto Chemical Co. Silica was fumed silica Qs-9 from Tokuyama Sha and alumina was θ-alumina (AKP-G008) from Sumitomo Chemical Co., Ltd.

Table 1 shows the CMP results together with the compositions of the polishing slurries. In CMP using a polishing slurry comprising citric acid, adhesion of a polishing product to the polishing pad was little observed and a polishing rate was stable and constant until termination of polishing. On the other hand, in CMP using a polishing slurry comprising not citric acid but a carboxylic acid (glutaric acid) or an amino acid (glycine), a large amount of polishing product was adhered to the polishing pad at the end of polishing.

In CMP using a polishing slurry comprising citric acid, an in-plane uniformity of the polished surface was 5%. Then, CMP was conducted as described above, increasing a contact pressure of the polishing pad from 27.6 kPa (4 psi) to 34.5 kPa (5 psi). An in-plane uniformity was 3.5%. Adhesion of a polishing product to the polished surface was not observed.

Figure 4:
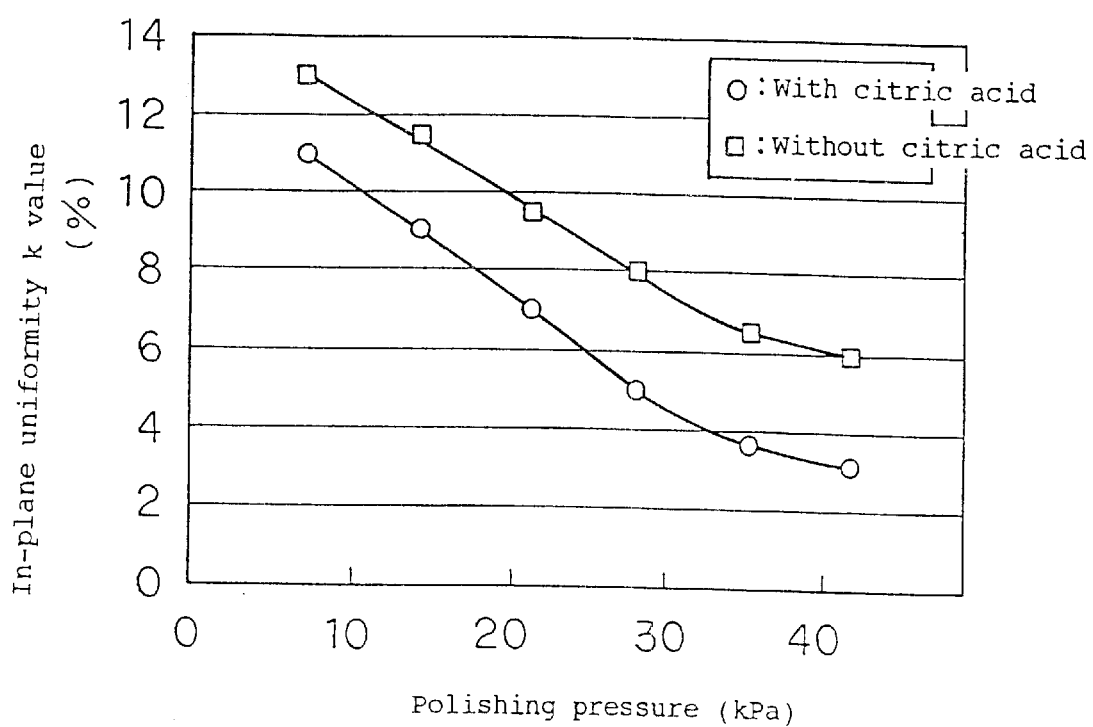
FIG. 4 is a graph showing variation in an in-plane uniformity (k value) plotted to a polishing pressure.

FIG. 4 shows variation of an in-plane uniformity (k value) plotted to a polishing pressure when CMP was conducted using a polishing slurry with or without citric acid. It can be seen from the figure that CMP using a polishing slurry with citric acid (○) gave a smaller k value, i.e., polishing with better in-plane uniformity at the same polishing pressure, compared with CMP using a polishing slurry without citric acid (□). It may be because a polishing product adheres to the polishing pad in CMP using a polishing slurry without citric acid while not in CMP using a polishing slurry comprising citric acid.

TABLE 1

| No. | Polishing grains (content/wt %) | Organic Acid (content/wt %) | $H_2O_2$ content (wt %) | BTA content (wt %) | pH regulator (pH) | Cu polishing rate (nm/min) | Adhesion of a polishing product to a polishing pad |
|---|---|---|---|---|---|---|---|
| 1 | Alumina (8) | Glycine (0.125) | 1.7 | 0.005 | None (8.0) | 211.3 | Yes |
| 2 | Silica (5) | Glutaric acid (0.16) | 0.51 | 0.005 | KOH (4.3) | 181.6 | Yes |
| 3 | Silica (5) | Citric acid (0.254) | 0.51 | 0.005 | KOH (4.3) | 300.8 | No |

TABLE 1-continued

| No. | Polishing grains (content/wt %) | Organic Acid (content/wt %) | H$_2$O$_2$ content (wt %) | BTA content (wt %) | pH regulator (pH) | Cu polishing rate (nm/min) | Adhesion of a polishing product to a polishing pad |
|---|---|---|---|---|---|---|---|
| 4 | Alumina (5) | Citric acid (1.50) Glutaric acid (0.16) Glycine (0.30) | 2.38 | 0.005 | KOH (5.5) | 911.1 | No |
| 5 | Alumina (5) | Citric acid (1.50) Glutaric acid (0.16) Glycine (0.30) | 2.38 | 0.005 | KOH (5.5) | 808.8 | No |
| 6 | Alumina (8) | Citric acid (0.75) Glutaric acid (0.16) Glycine (0.30) | 2.38 | 0.010 | KOH (5.5) | 616.2 | No |
| 7 | Alumina (8) | Citric acid (0.75) Glutaric acid (0.16) Glycine (0.30) | 2.38 | 0.010 | NH$_3$ (5.5) | 623.2 | No |
| 8 | Alumina (8) | Citric acid (0.75) Glutaric acid (0.16) Glycine (0.30) | 2.38 | 0.005 | KOH (5.5) | 768.9 | No |
| 9 | Alumina (8) | Citric acid (0.50) Glutaric acid (0.16) Glycine (0.30) | 2.38 | 0.005 | KOH (5.5) | 619.9 | No |
| 10 | Alumina (8) | Citric acid (0.50) Glutaric acid (0.16) Glycine (0.30) | 2.38 | 0.005 | NH$_3$ (5.5) | 610.5 | No |

Preparation of a secondary-particle containing θ-alumina dispersion

Secondary-particle containing θ-alumina was prepared using θ-alumina (Sumitomo Chemical Co., Ltd.; AKP-G008). Observation of the θ-alumina before preparation by SEM indicated that it consisted of aggregates made of a number of fused primary particles with the minimum and the maximum particle sizes of 0.03 μm and 0.08, μm (an average particle size: 0.05 μm), respectively. The average particle size of the aggregates were 10 μm. Although there were sometimes observed primary particles with a particle size considerably smaller or larger in relation to the minimum or the maximum size, respectively, they did not affect properties of a polishing slurry finally obtained or contribute an average particle size at all.

Then, Aqualic HL415, a dispersing agent from Nippon Shokubai Co., Ltd., was added to ion-exchanged water to 4 wt %, and then θ-alumina before preparation was added to 40 wt %. The resultant mixture was subject to dispersion at a rotating speed of 1000 rpm using a bead mill (Inoue Seisakusho; Super mill). A plurality of dispersions were prepared, varying a dispersion time from 20 to 400 min.

A particle size distribution for the overall particles was determined for the θ-alumina contained in each dispersion using a particle size analyzer (Beckmann-Kolter; LS-230). The maximum particle size was determined from the particle size distribution for the overall particles. A particle size distribution for secondary particles was calculated by subtracting the particle size distribution for primary particles from that for the overall particles. An average particle size of secondary particles was determined by statistically processing the particle distribution of secondary particles. Furthermore, for a dispersion in which a dispersion time was 200 min, the content of secondary particles to the overall secondary-particle containing θ-alumina and the proportion of secondary particles with a particle size of 0.05 μm to 0.5 μm both inclusive to the overall secondary particles were determined.

Table 3 shows the maximum particle size (●) and an average particle size of secondary particles (○) for θ-alumina in a dispersion at several dispersion times. Large secondary particles with a particle size of more than 3 μm were present for a dispersion time of 120 min or less, while the maximum particle size was less than 1 μm for a dispersion time of 140 min or longer.

When a dispersion time was 200 min, an average particle size of secondary particles was 0.15 μm, the maximum particle size was 0.6 μm, the content of secondary particles to the overall secondary-particle containing θ-alumina was 74 wt %, and the proportion of secondary particles with a particle size of 0.05 μm to 0.5 μm inclusive to the overall secondary particles was 62 wt %. In addition, there were observed no significant foreign matters.

Example 2

Among the dispersions prepared as described above, the dispersion in which a dispersion time was 200 min was used to prepare polishing slurry 1 with pH 7 comprising 5.03 wt % of secondary-particle containing θ-alumina, 0.47 wt % of citric acid and 1.9 wt % of H$_2$O$_2$, in which pH was adjusted with ammonia and H$_2$O$_2$ was added just before CMP.

On a 6 inch silicon substrate were formed a silicon oxide film, a groove for interconnection, an opening for an interconnect, a barrier metal film and a copper film as described in Example 1.

The substrate thus obtained was subject to CMP using polishing slurry 1 and the copper film was polished by about 2 μm. A polishing rate was constant and polishing was stable until termination of polishing. Then, contamination of the polishing pad was evaluated visually or on the basis of the polishing rate, and it was found that there was little adhesion of a polishing product to the polishing pad. SEM observation of the polished surface indicated that scratches were prevented and an in-plane uniformity of the polished surface was 5%. Furthermore, CMP was conducted as described above, increasing a contact pressure of the polishing pad from 27.6 kPa (4 psi) to 34.5 kPa (5 psi). An in-plane uniformity was 3.5%. Adhesion of a polishing product to the polished surface was not observed and scratches were prevented.

Example 3

Polishing slurry 2 was prepared as described for polishing slurry 1, replacing citric acid with malic acid. Using polishing slurry 2, CMP was conducted as described above. A polishing rate was constant and polishing was stable until termination of polishing. Then, contamination of the polishing pad was evaluated visually or on the basis of the polishing rate, and it was found that there was little adhesion of a polishing product to the polishing pad. SEM observation of the polished surface indicated that scratches were prevented and an in-plane uniformity of the polished surface was 5% or less. Furthermore, CMP was conducted as described above, increasing a contact pressure of the polishing pad from 27.6 kPa (4 psi) to 34.5 kPa (5 psi). An in-plane uniformity was 3.5%. Adhesion of a copper polishing product to the polished surface was riot observed and scratches were prevented.

Comparative Example 1

Polishing slurry 3 was prepared as described for polishing slurry 2, replacing θ-alumina with commercially available α-alumina. Using polishing slurry 3, CMP was conducted as described above, and a large amount of a polishing product adhered to the polishing pad. An in-plane uniformity was 8% at a contact pressure of the polishing pad of 27.6 kPa (4 psi) while 6. 5% at 34.5 kPa (5 psi).

What is claimed is:

1. A process for forming a metal interconnect comprising the steps of: forming a concave in an insulating film formed on a substrate, forming a copper-containing metal film over the whole surface such that the concave is filled with the metal and then polishing the copper-containing metal film by chemical mechanical polishing, characterized in that the polishing step is conducted using a chemical mechanical polishing slurry comprising a polishing material, an oxidizing agent and an adhesion inhibitor preventing adhesion of a polishing product to a polishing pad, while contacting the polishing pad to a polished surface with a pressure of at least 27 kPa.

2. The process for forming a metal interconnect as claimed in claim 1 where the adhesion inhibitor is citric acid.

3. The process for forming a metal interconnect as claimed in claim 1 where the content of the adhesion inhibitor in the chemical mechanical polishing slurry is 0.01 wt % to 5 wt % both inclusive.

4. A process for forming a metal interconnect comprising forming a concave in an insulating film formed on a substrate, forming a copper-containing metal film on the whole surface such that the concave is filled with the metal and then polishing the copper-containing metal film by chemical mechanical polishing, characterized in that the polishing step is conducted using a chemical mechanical polishing slurry comprising θ alumina mainly containing secondary particles made of aggregated primary particles as a polishing material, an oxidizing agent and an inhibitor preventing adhesion of a polishing product to a polishing pad, while contacting the polishing pad to a polished surface with a pressure of at least 27 kPa where the chemical mechanical polishing slurry comprises θ-alumina mainly containing second particles made of aggregated primary particles as the polishing material.

5. A process for forming a metal interconnect comprising the steps of forming a concave in an insulating film formed on a substrate, forming a copper-containing metal film over the whole surface such that the concave is filled with the metal and then polishing the copper-containing metal film by chemical mechanical polishing, characterized in that the polishing step is conducted using a chemical mechanical polishing slurry comprising θ-alumina mainly containing secondary particles made of aggregated primary particles as a polishing material, an oxidizing agent and an organic acid, while contacting the polishing pad to a polished surface with a pressure of at least 27 kPa.

6. The process for forming a metal interconnect as claimed in claim 5 where the content of the secondary particles of the θ-alumina is 60 wt % or more to the total amount of the θ-alumina.

7. The process for forming a metal interconnect as claimed in claim 5 where the average particle size of the secondary particles of the θ-alumina is 0.05 $\mu$m to 0.5 $\mu$m both inclusive.

8. The process for forming a metal interconnect as claimed in claim 5, where the θ alumina comprises 50 wt % or more of secondary particles with a particle size of 0.05 $\mu$m to 0.5 $\mu$m both inclusive to the total amount of the secondary particles.

9. The process for forming a metal interconnect as claimed in claim 5 where primary and secondary particles with a particle size of more than 2 $\mu$m are substantially absent in the θ-alumina.

10. The process for forming a metal interconnect as claimed in claim 5 where the average particle size of the primary particles of the θ-alumina is 0.005 $\mu$m to 0.1 $\mu$m both inclusive.

* * * * *